US009312174B2

(12) United States Patent  (10) Patent No.: US 9,312,174 B2
Tung  (45) Date of Patent: Apr. 12, 2016

(54) METHOD FOR MANUFACTURING CONTACT PLUGS FOR SEMICONDUCTOR DEVICES

(71) Applicant: UNITED MICROELECTRONICS CORP., Hsin-Chu (TW)

(72) Inventor: Yu-Cheng Tung, Kaohsiung (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 143 days.

(21) Appl. No.: 14/109,920

(22) Filed: Dec. 17, 2013

(65) Prior Publication Data

US 2015/0170966 A1    Jun. 18, 2015

(51) Int. Cl.
  *H01L 21/768*  (2006.01)
  *H01L 21/28*   (2006.01)
  *H01L 21/74*   (2006.01)

(52) U.S. Cl.
  CPC .......... *H01L 21/76897* (2013.01); *H01L 21/28* (2013.01); *H01L 21/743* (2013.01); *H01L 21/768* (2013.01)

(58) Field of Classification Search
  CPC .. H01L 21/76897; H01L 21/28; H01L 21/743
  See application file for complete search history.

(56) References Cited

U.S. PATENT DOCUMENTS

| 6,100,137 | A  | * | 8/2000 | Chen ....................... H01L 28/91 |
|           |    |   |        | 257/E21.019 |
| 6,534,813 | B1 |   | 3/2003 | Park et al. |
| 2005/0277755 | A1 | * | 12/2005 | Hamada ................... C08L 83/06 |
|           |    |   |        | 528/32 |
| 2009/0152734 | A1 |   | 6/2009 | Smayling |
| 2012/0164836 | A1 | * | 6/2012 | Chumakov .......... H01L 21/0337 |
|           |    |   |        | 438/702 |
| 2012/0286375 | A1 | * | 11/2012 | Cai .................. H01L 21/823412 |
|           |    |   |        | 257/412 |
| 2013/0189833 | A1 | * | 7/2013 | Baars ................ H01L 21/76897 |
|           |    |   |        | 438/586 |
| 2014/0070155 | A1 | * | 3/2014 | Cohen ..................... H01L 45/06 |
|           |    |   |        | 257/2 |

FOREIGN PATENT DOCUMENTS

CN    1153273 C    6/2004

* cited by examiner

*Primary Examiner* — Mohammad Choudhry
(74) *Attorney, Agent, or Firm* — Winston Hsu; Scott Margo

(57) ABSTRACT

A method for manufacturing contact plugs for semiconductor devices includes the following steps. A substrate is provided. The substrate includes a plurality of transistor and a first dielectric layer filling spaces between the transistors formed thereon. The transistors respectively include a gate and a source/drain. A patterned sacrificial layer is formed on the first dielectric layer. The patterned sacrificial layer includes a plurality of first openings corresponding to the gates of the transistors. A second dielectric layer filling up the first openings in the patterned sacrificial layer is formed and followed by removing the sacrificial layer to form a plurality of second openings in the second dielectric layer. The second openings are formed correspondingly to the sources/drains of the transistors. An etching process is performed to etch the first dielectric layer through the second openings to form a plurality of first contact holes exposing the sources/drains of the transistors.

17 Claims, 10 Drawing Sheets

METHOD FOR MANUFACTURING CONTACT PLUGS FOR SEMICONDUCTOR DEVICES

BACKGROUND OF THE INVENTION

1. Field of the Invention

The invention relates to a method for manufacturing contact plugs for semiconductor devices, and more particularly, to a method for manufacturing contact plugs for sources/drains of semiconductor transistor devices.

2. Description of the Prior Art

In the integrated circuit (IC), electrical connection between different semiconductor devices are constructed by contact structures such as contact plugs and interconnection structures. However, along with the miniaturization of the IC, reduction of the feature size, and progress in fabrication of semiconductor device, the line width of interconnections and the feature size of semiconductor devices have been continuously shrunk. With this trend, any misalignment occurs at contact plugs fabrication process may cause contact plug shift issue and even cause short circuit within a device or between devices. In one circumstance that a gate structure and a source/drain of one device are electrically connected due to contact plug shift, a short circuit occurs within the device and thus the device is failed. In another circumstance that the short circuit occurs at different devices, the whole IC may be failed.

Therefore, a method for manufacturing contact plugs for semiconductor devices that is able to prevent device failure due to contact plug shift issue are still in need.

SUMMARY OF THE INVENTION

According to an aspect of the present invention, a method for manufacturing contact plugs for semiconductor devices is provided. According to the method, a substrate is provided. The substrate includes a plurality of transistors and a first dielectric layer filling spaces between the transistors formed thereon. The transistors respectively include a gate and a source/drain. Next, a patterned sacrificial layer is formed on the first dielectric layer. The patterned sacrificial layer includes a plurality of first openings corresponding to the gates of the transistors. After forming the patterned sacrificial layer, a second dielectric layer filling up the first openings in the patterned sacrificial layer is formed and followed by removing the patterned sacrificial layer to form a plurality of second openings in the second dielectric layer. The second openings are formed correspondingly to the sources/drains of the transistors. Then, an etching process is performed to etch the first dielectric layer through the second openings to form a plurality of first contact holes exposing the sources/drains of the transistors.

According to the method for manufacturing the contact plugs for semiconductor devices provided by the present invention, the contact holes are formed by replacing the patterned sacrificial layer, therefore a contact hole pattern with larger process window is obtained. More important, short circuit between the gates and the sources/drains caused by contact plug misalignment or contact plug shift is avoided.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-8 are schematic drawings illustrating a method for manufacturing contact plugs for semiconductor devices provided by a first preferred embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, FIG. 7 is a schematic drawing in a step subsequent to FIG. 6, and FIG. 8 is a schematic drawing in a step subsequent to FIG. 7.

FIGS. 9-10 are schematic drawings illustrating a method for manufacturing contact plugs for semiconductor devices provided by a second preferred embodiment of the present invention, wherein FIG. 10 is a schematic drawing in a step subsequent to FIG. 9.

FIGS. 11-15 are schematic drawings illustrating a method for manufacturing contact plugs for semiconductor devices provided by a third preferred embodiment of the present invention, wherein FIG. 12 is a schematic drawing in a step subsequent to FIG. 11, FIG. 13 is a schematic drawing in a step subsequent to FIG. 12, FIG. 14 is a schematic drawing in a step subsequent to FIG. 13, and FIG. 15 is a schematic drawing in a step subsequent to FIG. 14.

FIGS. 17-18 are schematic drawings illustrating a modification to the third preferred embodiment, wherein FIG. 18 is a schematic drawing in a step subsequent to FIG. 17.

FIGS. 19-20 are schematic drawings illustrating the methods for manufacturing contact plugs for semiconductor devices provided by the first to fourth preferred embodiments of the present invention in step subsequent to FIGS. 8 and 15, wherein FIG. 20 is a schematic drawing in a step subsequent to FIG. 19.

DETAILED DESCRIPTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have been described in detail in order to avoid obscuring the invention.

Although the method is illustrated and described as a series of acts or events, it will be appreciated that the present invention is not limited by the illustrate ordering of such acts or events.

Figure 1:
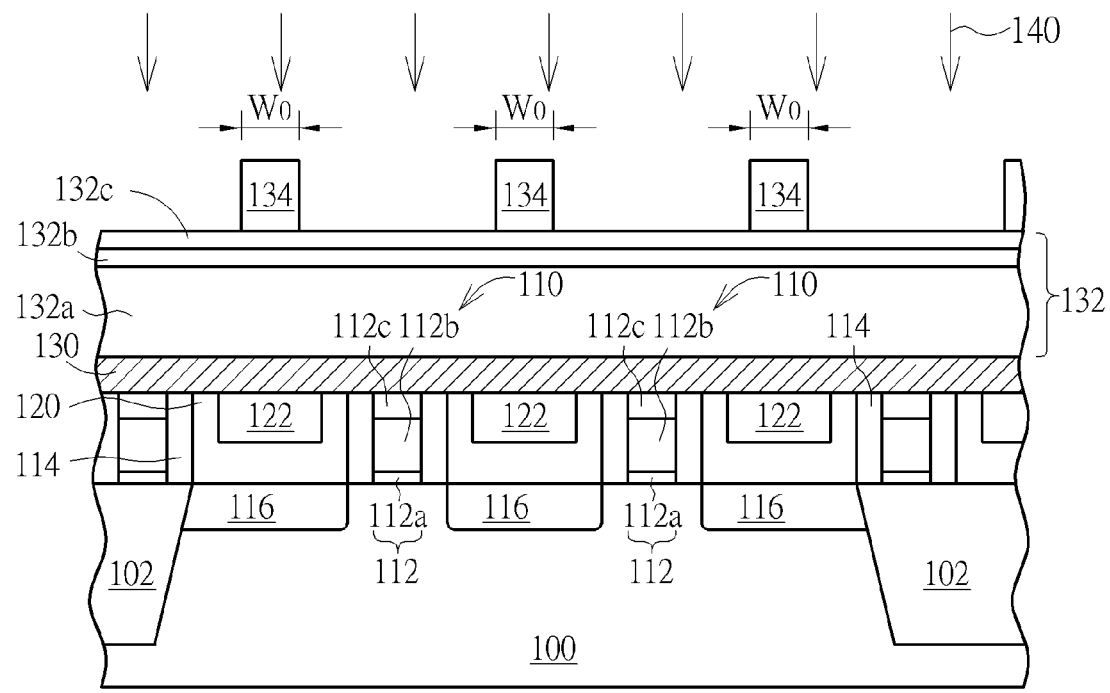

Please refer to FIGS. 1-8, which are schematic drawings illustrating a method for manufacturing contact plugs for semiconductor devices provided by a first preferred embodiment of the present invention. As shown in FIG. 1, the preferred embodiment first provides a substrate 100. A plurality of transistors 110 are formed on the substrate 100 and electrically isolated by shallow trench isolations (STIs) 102 formed in the substrate 100. In the preferred embodiment, the transistors 110 respectively include agate 112, a spacer 114, and a source/drain 116. The gate 112 of each transistor 110 includes a gate dielectric layer 112a, a polysilicon dummy gate 112b, and a hard mask layer 112c. It should be understood that the transistors 110 can further include light doped drains (not shown), but those elements are omitted from FIGS. 1-8 for simplicity. Furthermore, selective strain scheme (SSS) can be used in the preferred embodiment. For example, a selective epitaxial growth (SEG) method can be used to form an epitaxial source/drain 116, but not limited to this. On the transistors 110, a contact etch stop layer (hereinafter abbreviated as CESL) 120 and a first dielectric layer 122 are sequentially formed and planarized. Thus, top surfaces of the gates 112, topmost portions of the CESL 120 and top surface of the first dielectric layer 122 are coplanar. It is noteworthy that the first dielectric layer 122 filling spaces between the transistors 110 serves as an inter-layer dielectric (ILD) layer in accordance with the preferred embodiment. In other words, the transistors 110 are embedded in the CESL 120 and the first dielectric layer 122 as shown in FIG. 1. Since the steps and material choices for forming the abovementioned elements are well-known to those skilled in the art, those details are omitted herein in the interest of brevity.

Please still refer to FIG. 1. According to the preferred embodiment, a sacrificial layer 130 is then formed on the first dielectric layer 122. An etching rate of the sacrificial layer 130 is different from an etching rate of the first dielectric layer 122. Accordingly, the sacrificial layer 130 includes materials different from the first dielectric layer 122. For example, when the first dielectric layer 122 includes silicon oxide, the sacrificial layer 130 preferably includes material different from the silicon oxide, such as polysilicon, but not limited to this. Additionally, a thickness of the sacrificial layer 130 can be, for example but not limited to, 1000 angstroms (Å). Next, a mask layer 132 is selectively formed on the sacrificial layer 130. According to the preferred embodiment, the mask layer 132 can be a multilayered structure. For example, the multilayered mask layer 132 includes an advanced pattern film 132a (hereinafter abbreviated as APF), a dielectric anti-reflective coating (hereinafter abbreviated as DARC) 132b, and a bottom anti-reflective coating (hereinafter abbreviated as BARC) 132c, but not limited to this. Furthermore, a patterned photoresist layer 134 for defining contact plugs is formed on the mask layer 132. The patterned photoresist layer 134 includes a width $W_0$ as shown in FIG. 1.

Figure 2:
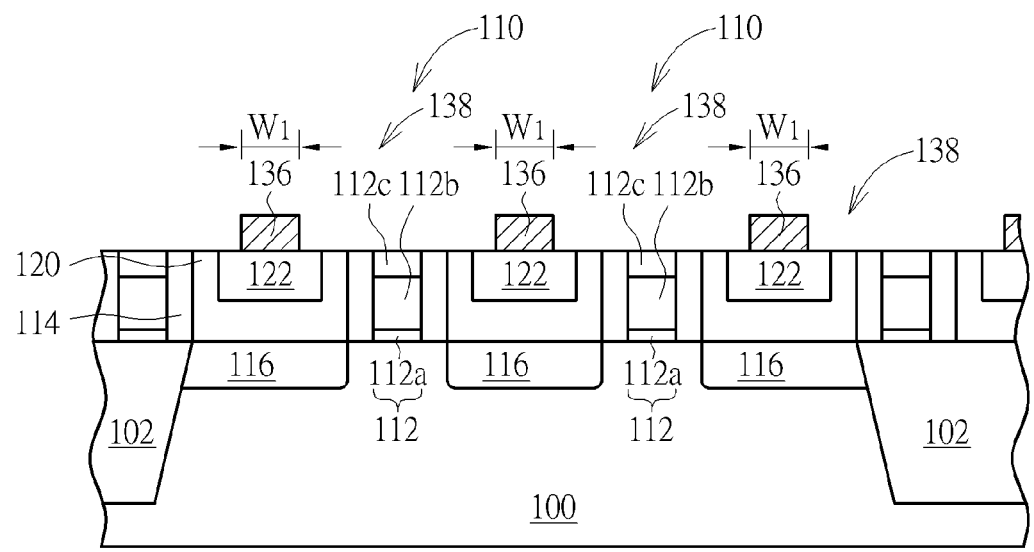

Please refer to FIG. 2. Subsequently, an etching process 140 is performed. Accordingly, the mask layer 132 and the sacrificial layer 130 are etched through the patterned photoresist layer 134 to form a patterned sacrificial layer 136 on the first dielectric layer 122. The patterned photoresist layer 134 and the mask layer 132 are then removed. As shown in FIG. 2, the patterned sacrificial layer 136 has a plurality of first openings 138 formed therein. More important, the patterned sacrificial layer 136 is formed correspondingly to the sources/drains 116 of the transistors 110. In other words, the first openings 138 are formed correspondingly to the gates 112 of the transistors 110, respectively. The patterned sacrificial layer 136 includes a width $W_1$ and the width $W_1$ of the patterned sacrificial layer 130 is often smaller than the width $W_0$ of the patterned photoresist layer 134.

Figure 3:
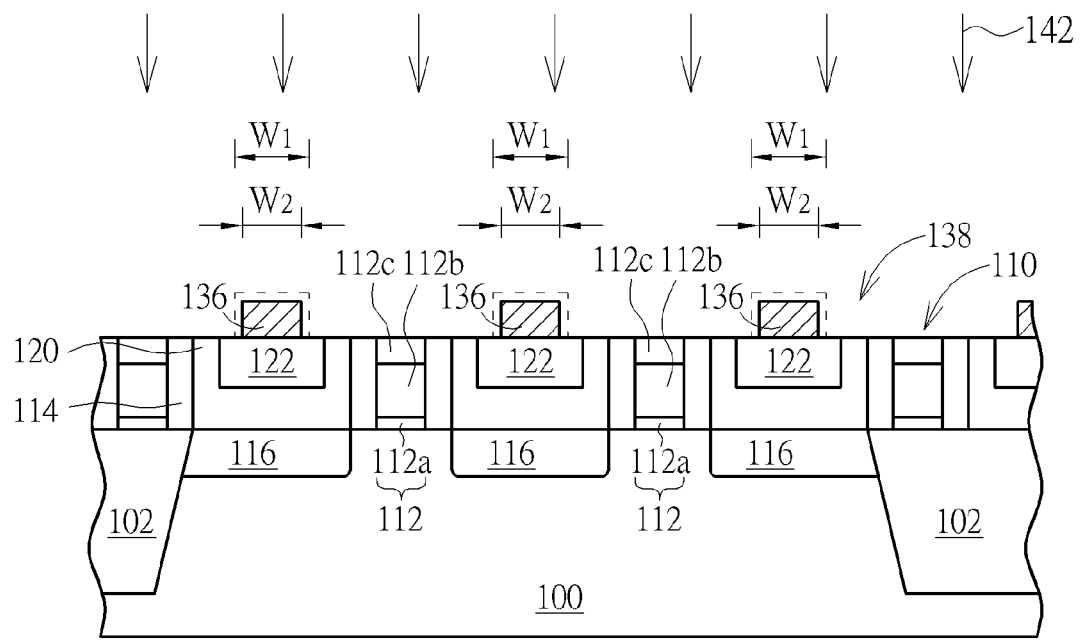

Please refer to FIG. 3. After forming the patterned sacrificial layer 136, a trimming step 142 is performed to the patterned sacrificial layer 136. The patterned sacrificial layer 136 is therefore shrunk and a reduced width $W_2$ is obtained after the trimming step 142. As shown in FIG. 3, the reduced width $W_2$ of the patterned sacrificial layer 136 after the trimming step 142 is smaller than the width $W_1$ of the patterned sacrificial layer 136 before the trimming step 142. In other words, the first openings 138 are enlarged by the trimming step 142. For emphasizing the difference between the patterned sacrificial layer 136 before and after the trimming step 142, the original size of the patterned sacrificial layer 136 is illustrated by dotted line in FIG. 3. It also should be noted that the trimming step 142 can be taken as a second etching process for forming the contact plugs because the reduced width $W_2$ is further smaller than the width $W_0$ of the patterned photoresist layer 134.

Figure 4:
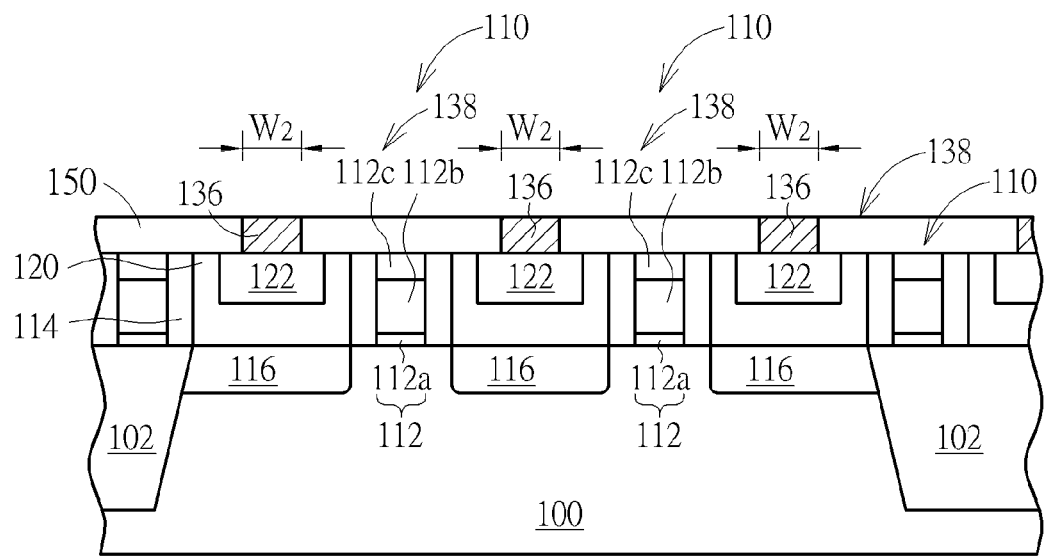

Please refer to FIG. 4. After the trimming step 142, a second dielectric layer 150 filling up the first openings 138 is formed and planarized. The second dielectric layer 150 preferably includes material different from the patterned sacrificial layer 136. As shown in FIG. 4, top surfaces of the patterned sacrificial layer 136 are all exposed after forming and planarizing the second dielectric layer 150.

Figure 5:
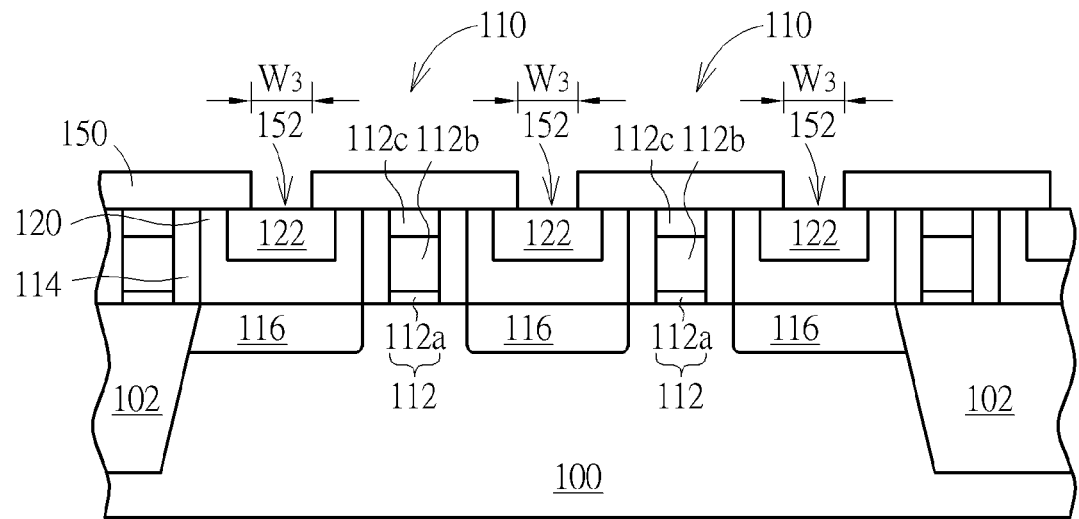

Please refer to FIG. 5. The patterned sacrificial layer 136 is then removed. Consequently, a plurality of second openings 152 are formed in second dielectric layer 150. It is noteworthy that the second openings 152 are formed correspondingly to the sources/drains 116 of the transistors 110. It is also noteworthy that since the second openings 152 are formed by removing the patterned sacrificial layer 136 from the substrate 100, the second openings 152 includes a width $W_3$ the same with the reduced width $W_2$ of the patterned sacrificial layer 136 after the trimming step 140.

Figure 6:
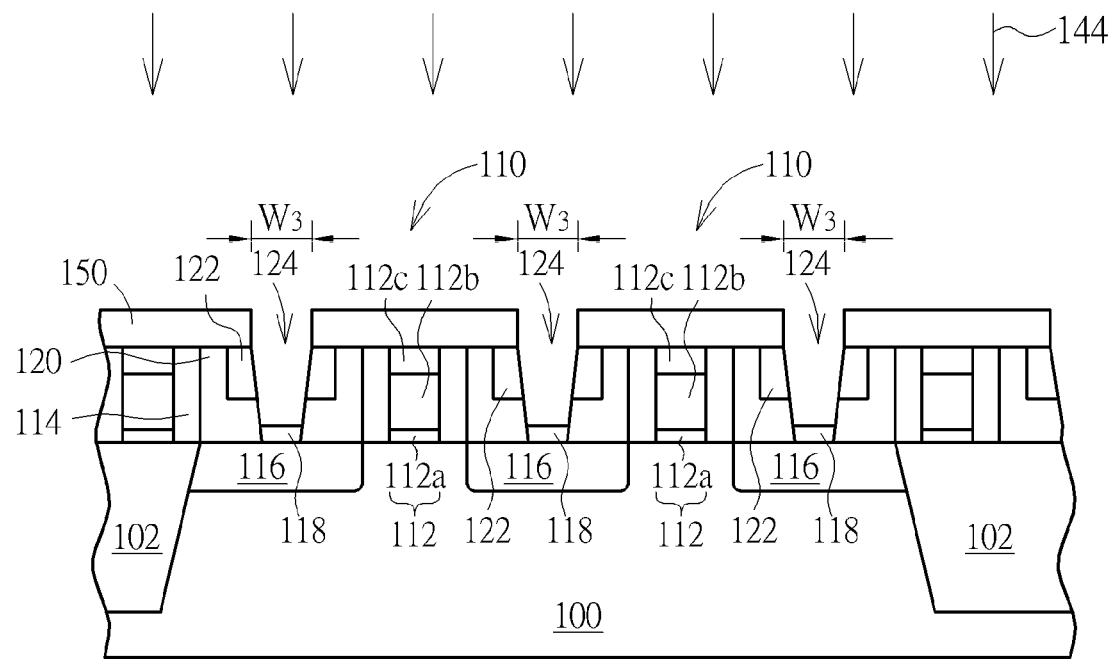

Please refer to FIG. 6. An etching process 144 is then performed to etch the first dielectric layer 122 and the CESL 120 through the second openings 152, and thus a plurality of first contact holes 124 exposing the sources/drains 116 of the transistors 110 are formed in the first dielectric layer 122 and the CESL 120. It is noteworthy that the width $W_3$ is transferred from the second openings 152 to the first contact holes 124. In other words, a width of the first contact holes 124 is equal to the width $W_3$ of the second openings 152, which is the same with the reduced width $W_2$ of the patterned sacrificial layer 136 after the trimming step 140. After the etching process 144, silicide layers 118 can be formed on portions of the sources/drains 116 exposed at bottoms of the first contact holes 124, respectively. The silicide layers 118 can be formed by any suitable process, preferably but not limited to post contact self-alignment silicide (salicide) process.

Figure 7:
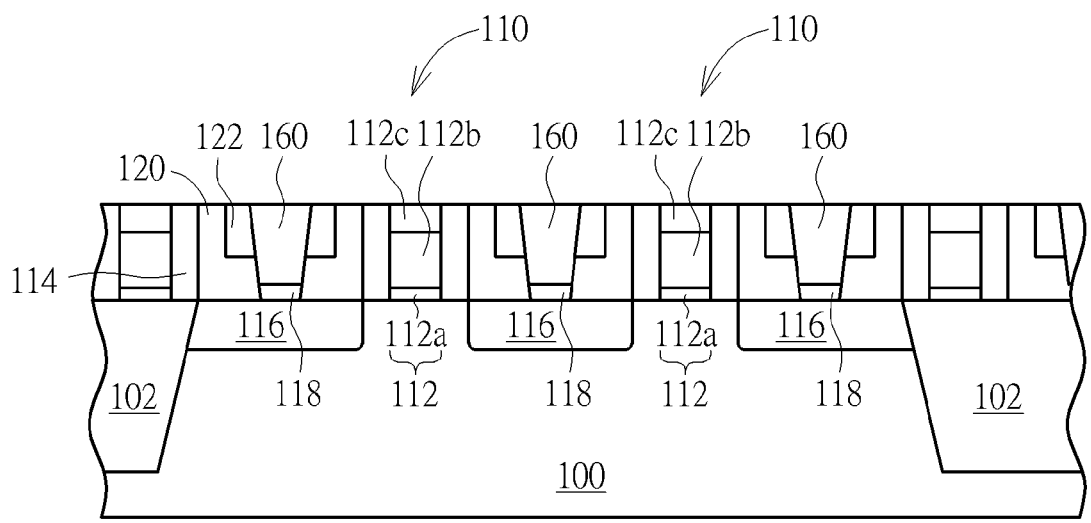

Please refer to FIG. 7. After forming the first contact holes 124 and the silicide layers 118, a conductive material is formed to fill up the first contact holes 124 and followed by performing a planarization process to remove the second dielectric layer 150 and superfluous conductive material. Consequently, a plurality of first contact plugs 160 are formed in the first dielectric layer 122 and the CESL 120. The first contact plugs 160 electrically connect to the sources/drains 116 of the transistor 110, respectively. It should be noted that a top surface of the first dielectric layer 122, top surfaces of the gates 112, and top surfaces of the first contact plugs 160 are all coplanar.

Figure 8:
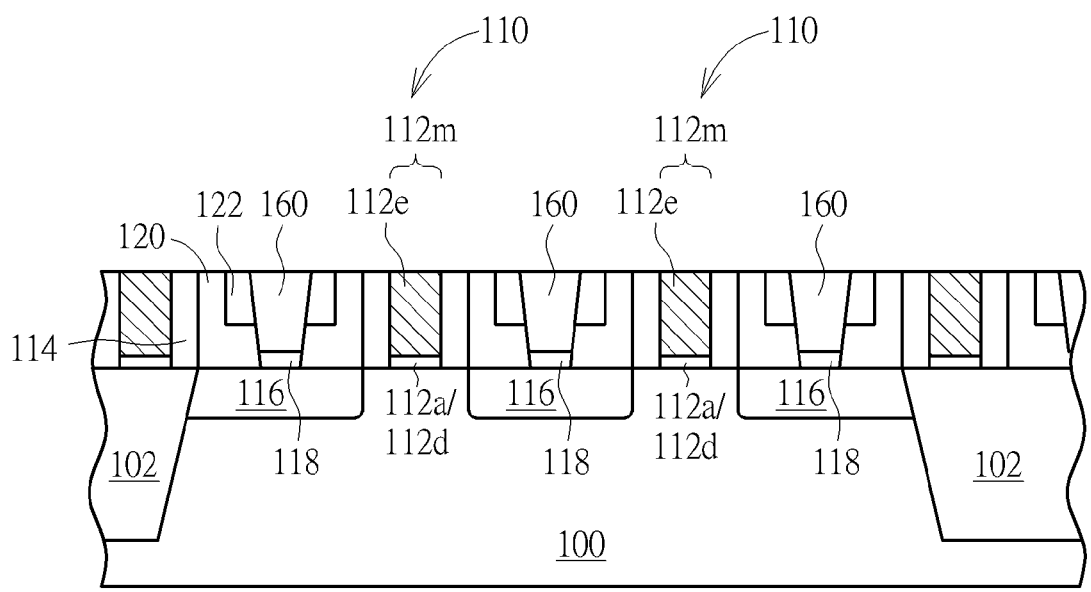

Please refer to FIG. 8. After forming the first contact plugs 160, a replacement metal gate (hereinafter abbreviated as RMG) process is performed. Typically, the hard mask layers 112c and the polysilicon dummy gates 112b are removed to form gate trenches and followed by filling up the gate trenches with required materials. For example but not limited to, when a high-k first approach is adopted, the gate dielectric layer 112a includes a high-k material, and a bottom barrier layer, an etch stop layer, a p-typed or an n-typed work function metal layer, a top barrier layer, and a gap-filling metal layer are sequentially formed in the gate trenches. In an alternative approach, that is the high-k last process, a high-k gate dielectric layer 112d is formed in the gate trench before the above mentioned layers are provided. Additionally, the gate dielectric layer 112a serves as an interfacial layer (IL) in the high-k last process. After filling the gate trenches with the gap-filling metal layer, a planarization process is performed to remove superfluous materials and thus a plurality of metal gates 112m are obtained. The metal gates 112m therefore includes the high-k gate dielectric layer 112a/112d and a metal gate electrode 112e which is a multilayered structure including the above mentioned layers.

Figure 9:
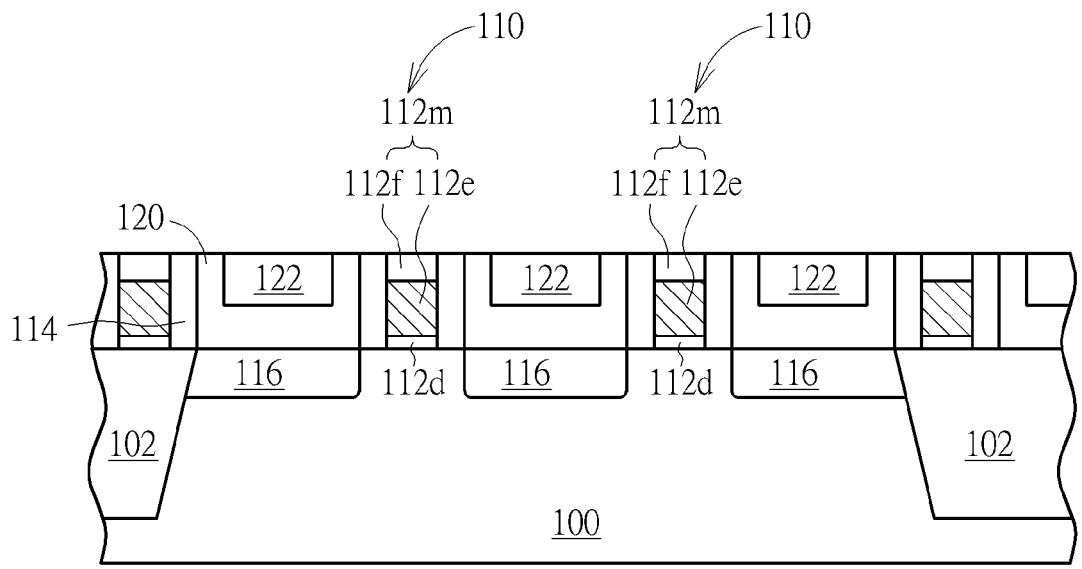
Figure 10:
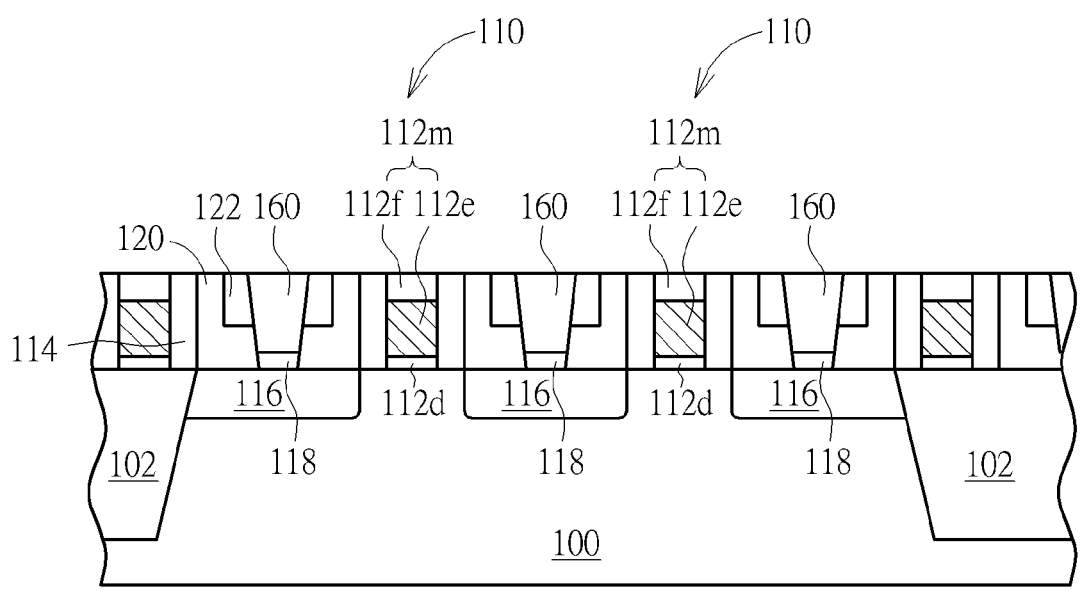

Please still refer to FIGS. 9-10, which are schematic drawings illustrating a method for manufacturing contact plugs for semiconductor devices provided by a second preferred embodiment of the present invention. It is noteworthy that elements the same in both of the first and second preferred embodiments are designated by the same numerals, and those details are omitted hereinafter in the interest of brevity. Different from the first preferred embodiment, which is to form the first contact plugs before the RMG process, the second preferred embodiment is to form the first contact plugs after the RMG process. As shown in FIG. 9, a plurality of transistors 110 are formed on a substrate 100 and a CESL 120 and a first dielectric layer 122 are formed to embed the transistors 110. Next, a high-k first or a high-k last RMG process is performed to form metal gates 112m for the transistors 110. As shown in FIG. 9, the metal gates 112m respectively include a gate dielectric layer 112a and/or a high-k gate dielectric layer 112d, a metal gate electrode 112e, and a selectively formed cap layer (not shown). The metal gate electrode 112e is a multilayered structure selectively including a bottom barrier layer, an etch stop layer, a p-typed or an n-typed work function metal layer, a top barrier layer, and a gap-filling metal layer. Those skilled in the art should understand that though the abovementioned layers are omitted from FIGS. 9-10 for simplicity, those layers should not be ignored in the RMG process. After forming the metal gates 112m, a silicide layer 112f is formed on each metal gate 112m by any suitable process.

After forming the metal gates 112m and the silicide layers 118, steps as illustrated in FIGS. 2-7 are performed. Since those steps have been detailed in FIGS. 2-7, it is omitted for simplicity. Accordingly, steps for forming the patterned sacrificial layer 136 (as shown in FIG. 2), performing the trimming step 142 to obtained a reduced width $W_2$ of the patterned sacrificial layer 136 (as shown in FIG. 3), forming the second dielectric layer 150 (as shown in FIG. 4), removing the patterned sacrificial layer 136 to form the second openings 152 (as shown in FIG. 5), performing an etching process 144 to form the first contact holes 124 through the second openings 152 (as shown in FIG. 6), forming the silicides 118 on the sources/drains 116 exposed at bottoms of the first contact holes 124 (as shown in FIG. 6), and forming the first contact plugs 160 respectively in the first contact holes 124 (as shown in FIG. 7) are sequentially performed. As shown in FIG. 10, the first contact plugs 160 are formed according to abovementioned steps after the RMG process.

According to the method for manufacturing contact plugs for semiconductor devices provided by the first and second preferred embodiments, the first contact plugs 160 are formed by replacing the patterned sacrificial layer 136, which is reduced by the trimming step 142. Therefore, process window for forming the first contact plugs 160 is improved. Furthermore, the method for manufacturing the contact plugs for semiconductor devices provided by the first and second preferred embodiments can be easily integrated before or after the RMG process and thus the process flexibility is improved.

Please refer to FIGS. 11-15, which are schematic drawings illustrating a method for manufacturing contact plugs for semiconductor devices provided by a second preferred embodiment of the present invention. It is noteworthy that elements the same in the first to the third preferred embodiments can include the same materials, therefore those details are omitted hereinafter in the interest of brevity.

Figure 11:
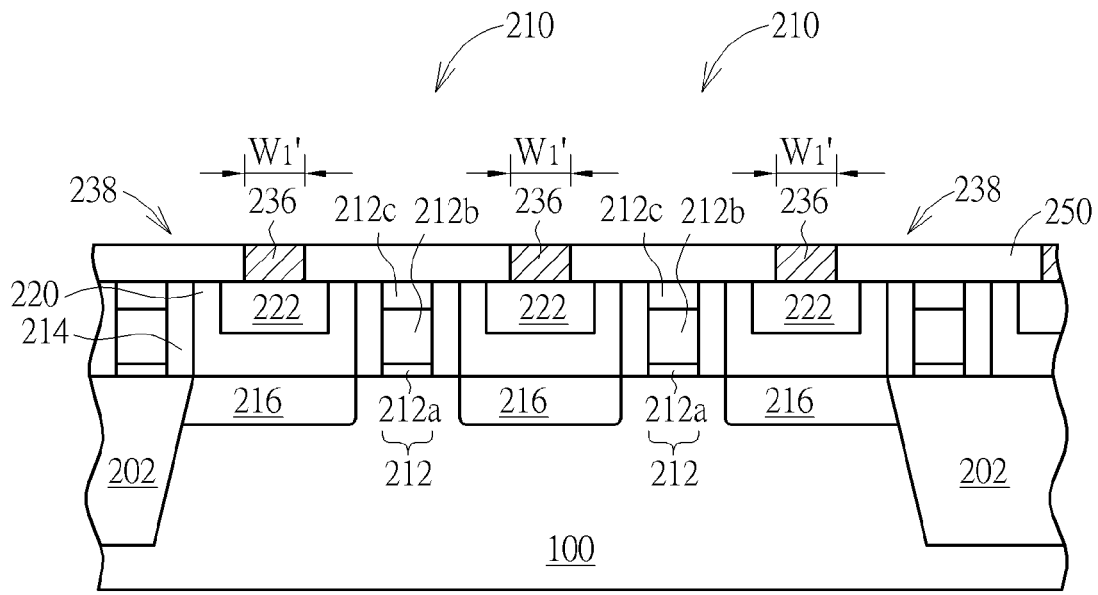

As shown in FIG. 11, the preferred embodiment first provides a substrate 200. A plurality of transistors 210 are formed on the substrate 200 and electrically isolated by STIs 202 formed in the substrate 200. In the preferred embodiment, the transistors 210 respectively include a gate 212, a spacer 214, and a source/drain 216. The gates 212 of the transistors 210 respectively include a gate dielectric layer 212a, a polysilicon dummy gate 212b, and a hard mask layer 212c. It should be understood that the transistors 210 can further include light doped drains, but those elements are omitted from FIGS. 11-15 for simplicity. On the transistor 210, a CESL 220 and a first dielectric layer 222 are sequentially formed and planarized. Thus, top surfaces of the gates 212, topmost portions of the CESL 220 and top surface of the first dielectric layer 222 are coplanar. It is noteworthy that the first dielectric layer 222 filling spaces between the transistors 210 serves as an ILD layer in accordance with the preferred embodiment. The transistors 210 are therefore embedded in the CESL 220 and the first dielectric layer 222 as shown in FIG. 11.

Please refer to FIG. 11 again. According to the preferred embodiment, a sacrificial layer (not shown) is then formed on the first dielectric layer 222 and followed by selectively forming a mask layer (not shown) on the sacrificial layer. According to the preferred embodiment, the mask layer can be a multilayered structure including an APF, a DARC, and a BARC, but not limited to this. Furthermore, a patterned photoresist layer (not shown) for defining contact plugs is formed on the mask layer. Subsequently, the mask layer and the sacrificial layer are etched through the patterned photoresist layer to form a patterned sacrificial layer 236 on the first dielectric layer 222. As shown in FIG. 11, the patterned sacrificial layer 236 has a plurality of first openings 238 formed therein. More important, the patterned sacrificial layer 236 is formed correspondingly to the sources/drains 216 of the transistors 210. In other words, the first openings 238 are formed correspondingly to the gates 212 of the transistors 210, respectively. As shown in FIG. 11, the first openings 238 respectively include a width $W_1'$. Next, a second dielectric layer 250 filling up the first openings 238 in the patterned sacrificial layer 236 is formed and planarized. As shown in FIG. 11, top surfaces of the patterned sacrificial layer 236 are all exposed after forming and planarizing the second dielectric layer 250.

Figure 12:
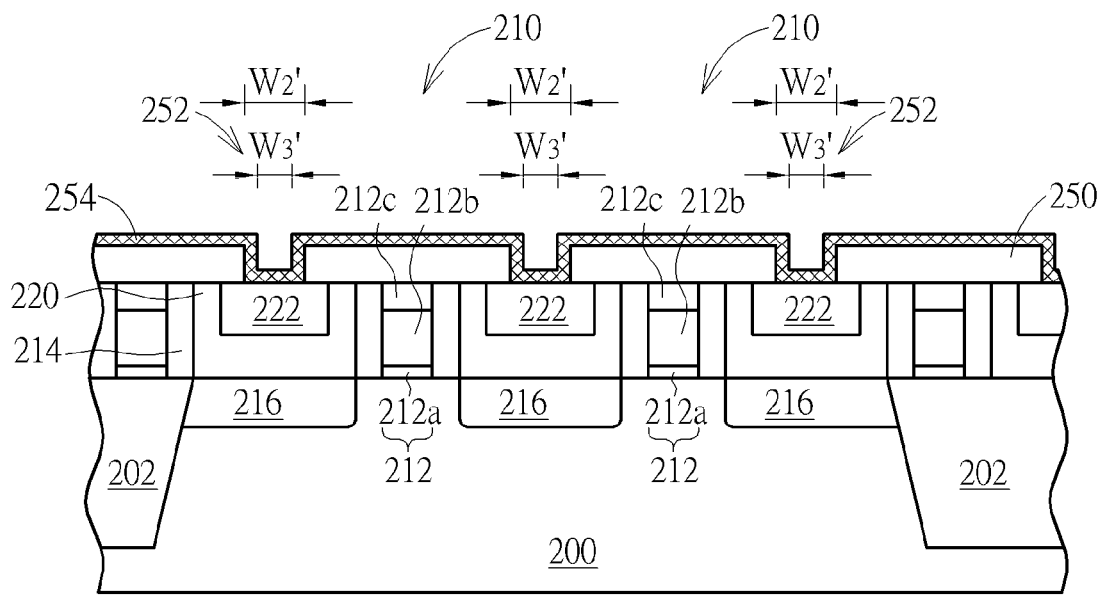

Please refer to FIG. 12. After forming the second dielectric layer 250, the patterned sacrificial layer 236 is removed. Consequently, a plurality of second openings 252 are formed in second dielectric layer 250. It is noteworthy that the second openings 252 are formed correspondingly to the sources/drains 216 of the transistors 210. It is also noteworthy that since the second openings 252 are formed by removing the patterned sacrificial layer 236 from the substrate 200, the second openings 252 includes a width $W_2'$ the same with the width $W_1'$ of the patterned sacrificial layer 236. Next, a liner 254 is blanketly formed on the second dielectric layer 250. It is noteworthy that the liner 254 covers sidewalls and bottoms of the second openings 252. Consequently, the width $W_2'$ of the second openings 252 is reduced by the liner 254 covering the sidewalls of the second openings 252, and thus a reduced width $W_3'$ of the second openings 252 is obtained. The liner 254 includes, for example but not limited to, silicon oxide or silicon nitride. It is should be noted that since deviation always generated during the process, the liner 254 is formed not only to obtain the reduced width $W_3'$, but also to compensate the bias or deviation generated in the aforementioned steps.

Additionally, in a modification to the third preferred embodiment, a trimming step can be performed to the patterned sacrificial layer 236 before forming the second dielectric layer 250. Therefore the width $W_1'$ of the patterned sacrificial layer 236 and the width $W_2'$ of the second openings 252 are reduced. And thus the reduced width $W_3'$ of the second openings 252 can be further reduced after forming the liner 254.

In another modification to the third preferred embodiment, a patterned second dielectric layer 250 can be formed on the first dielectric layer 222. The patterned second dielectric layer 250 includes a plurality of second openings 252 formed correspondingly to the sources/drains 216 of the transistors 210. Next, the liner 254 is formed to cover sidewalls and bottoms of the second openings 252 for reducing the width $W_2'$ of the second openings 252, and thus the reduced width $W_3'$ is still obtained.

Figure 13:
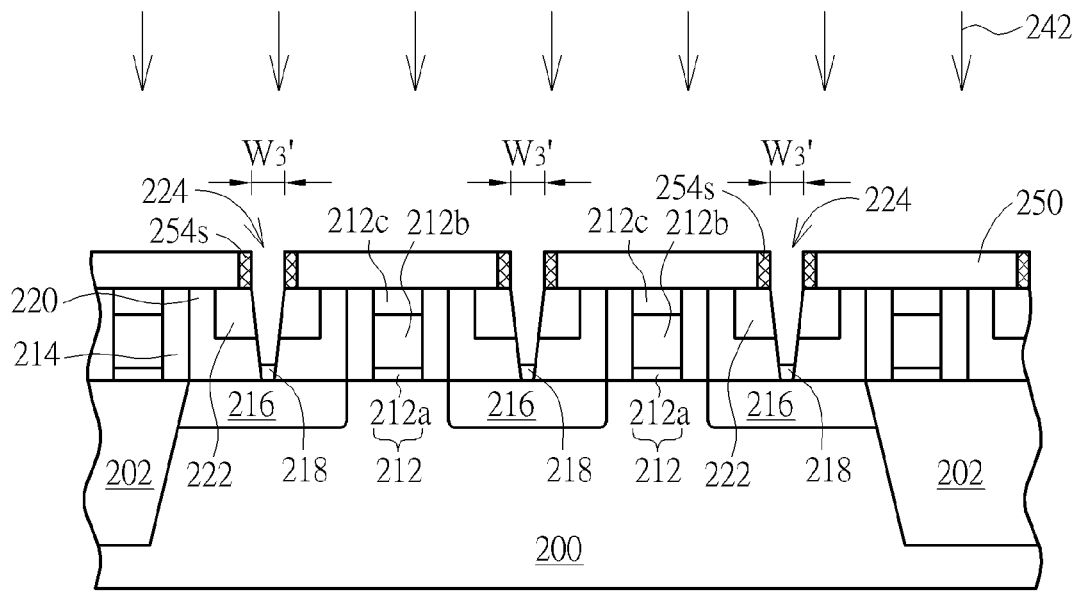

Please refer to FIG. 13. Subsequently, an etching process 242 is performed to etch the first dielectric layer 222 and the CESL 220 and thus a plurality of first contact holes 224 exposing the sources/drains 216 of the transistors 210 are formed. It is noteworthy that the reduced width $W'_3$ of the second openings 250 is transferred to the first contact holes 224. In detail, the etching process 242 first etches the liner 254 covering the second dielectric layer 250 and the bottoms of the second openings 252, and thus the first dielectric layer 222 is exposed at the bottoms of the second openings 252. The liner 254 remained on sidewalls of the second openings 252 therefore serves as liner spacers 254s in the etching process 242. Then the first dielectric layer 222 and the CESL 220 are etched with the second dielectric layer 250 and the liner spacers 254s serving as the etching mask. Consequently, the obtained first contacts holes 224 include the reduced width $W'_3$. After the etching process 242, silicide layers 218 can be formed on the sources/drains 216 exposed at bottoms of the first contact holes 224. The silicide layers 218 can be formed by any suitable process, preferably but not limited to post contact salicide process.

Figure 14:
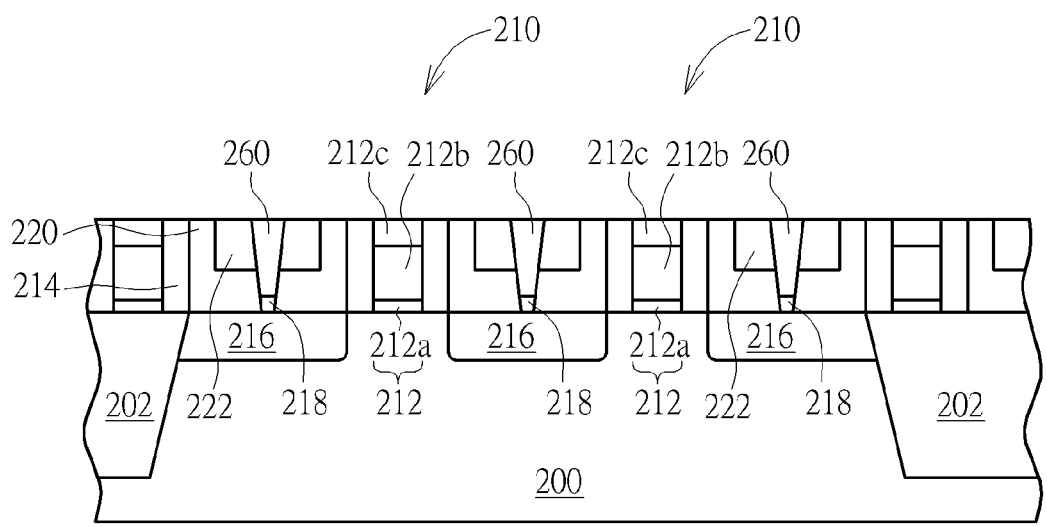

Please refer to FIG. 14. After forming the first contact holes 224 and the silicides 218, a conductive material is formed to fill up the first contact holes 224 and followed by performing a planarization process to remove the second dielectric layer 250 and superfluous conductive material to form a plurality of first contact plugs 260 electrically connected to the sources/drains 216 of the transistors 210, respectively. It should be noted that a top surface of the first dielectric layer 222, top surfaces of the gates 212, and top surfaces of the first contact plugs 260 are all coplanar.

Figure 15:
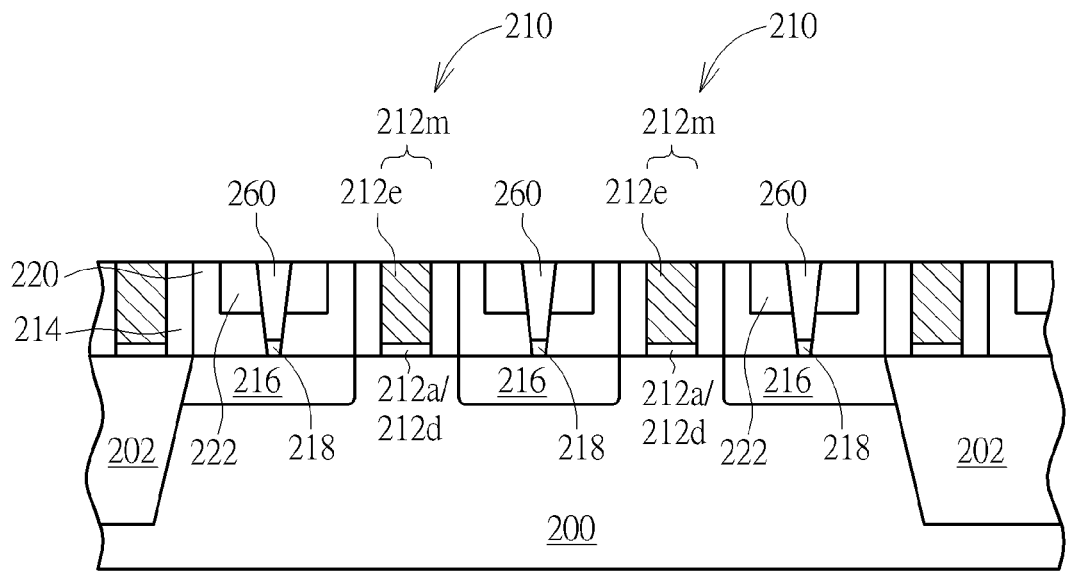

Please refer to FIG. 15. After forming the first contact plugs 260, a RMG process is performed. Typically, the hard mask layers 212c and the polysilicon dummy gates 212b are removed to form gate trenches and followed by filling up the gate trenches with required materials. Since the RMG process includes steps are the same with steps disclosed in the first preferred embodiment, those steps are omitted in the interest of brevity. Accordingly, a plurality of metal gates 212m are formed on the substrate 200. As shown in FIG. 15, the metal gates 212m respectively include a high-k gate dielectric layer 212a/212d and a metal gate electrode 212e which is a multilayered structure including the required metal layers.

Figure 16:
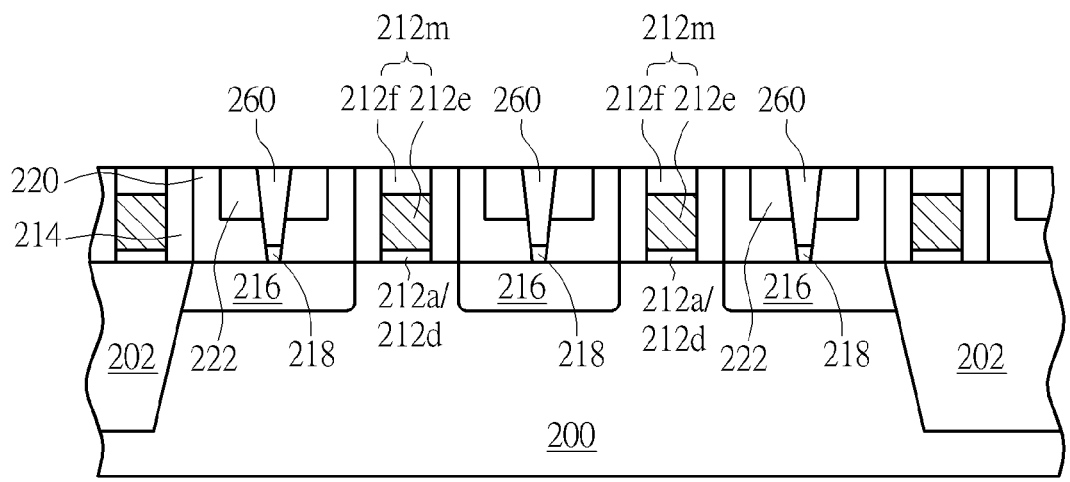
FIG. 16 is a schematic drawing illustrating a method for manufacturing contact plugs for semiconductor devices provided by a fourth preferred embodiment of the present invention.

Please refer to FIG. 16, which is a schematic drawing illustrating a method for manufacturing contact plugs for semiconductor devices provided by a fourth preferred embodiment of the present invention. It is noteworthy that elements the same in both of the third and fourth preferred embodiments are designated by the same numerals, and those details are omitted hereinafter in the interest of brevity. Different from the third preferred embodiment, which is to form the first contact plugs before the RMG process, the second preferred embodiment is to form the first contact plugs after the RMG process. Accordingly, a plurality of transistors 210 are formed on a substrate 200, and a CESL 220 and a first dielectric layer 222 are formed to embed the transistors 210. Please still refer to FIG. 16. Next, a high-k first or a high-k last RMG process is performed to form metal gates 212m for the transistors 210. The metal gates 212m respectively include a high-k gate dielectric layer 212d, a metal gate electrode 212e and a selectively formed cap layer (not shown), and the metal gate electrode 212e is a multilayered structure selectively including a bottom barrier layer, an etch stop layer, a p-typed or an n-typed work function metal layer, a top barrier layer, and a gap-filling metal layer. Those skilled in the art should understand that though the abovementioned layers are omitted from FIG. 16 for simplicity, those layers should not be ignored in the RMG process.

Please still refer to FIG. 16. After forming the metal gates 212m, a silicide layer 212f is formed on each metal gate 212m by any suitable process. Next, steps as illustrated in FIGS. 11-14 are performed. Since those steps have been detailed in FIGS. 11-14, it is omitted for simplicity. Accordingly, steps for forming the patterned sacrificial layer 236 (as shown in FIG. 11), forming the second dielectric layer 250 (as shown in FIG. 11), removing the patterned sacrificial layer 236 to form the second openings 252 (as shown in FIG. 12), forming the liner 254 to obtain the reduced width $W'_3$ (as shown in FIG. 12), performing an etching process 242 to form the first contact holes 224 (as shown in FIG. 13), and forming the first contact plugs 260 respectively in the first contact holes 224 (as shown in FIG. 14) are sequentially performed. As shown in FIG. 16, the first contact plugs 260 are formed according to abovementioned steps after the RMG process.

Figure 17:
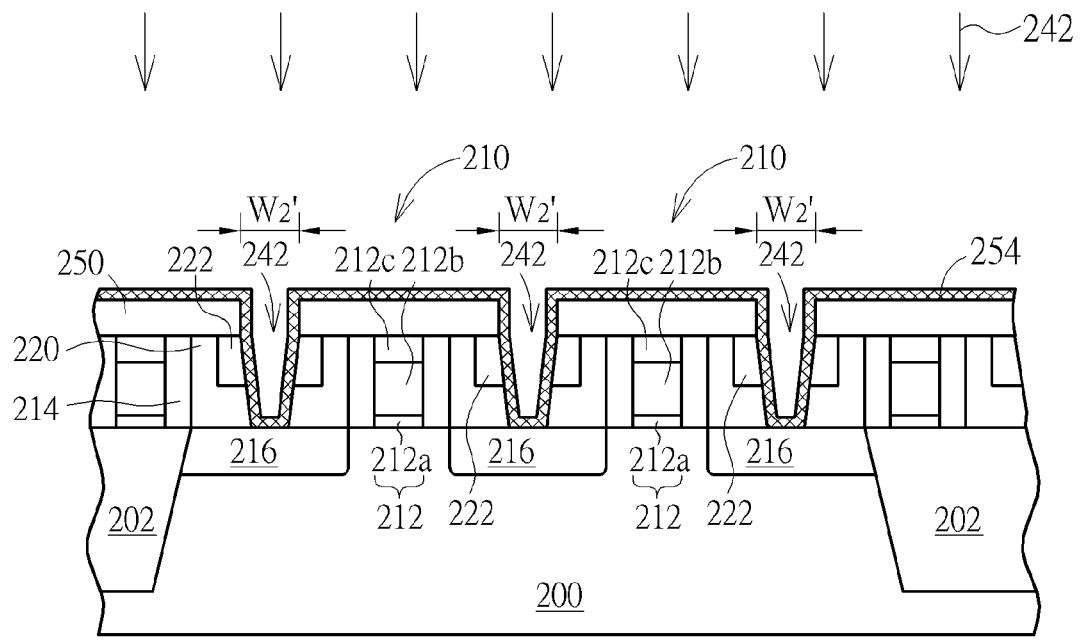
Figure 18:
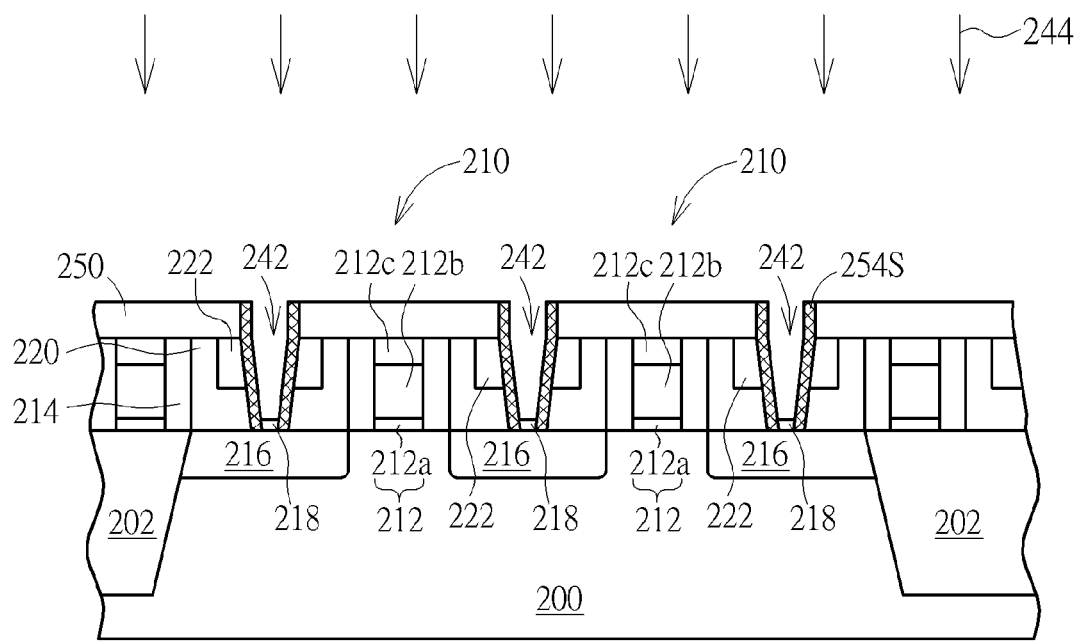

Please refer to FIGS. 17-18, which are schematic drawings illustrating an another modification to the third preferred embodiment in a step subsequent to FIG. 11. It should be understood that elements the same in the modification and the second preferred embodiment are designated by the same numerals, and steps the same in the modification and the second preferred embodiment are omitted for simplicity. According to the modification, the patterned sacrificial layer 236 is removed after forming and planarizing the second dielectric layer 250 and thus a plurality of second openings (not shown) are obtained. It is noteworthy that since the second openings are formed by removing the patterned sacrificial layer 236 from the substrate 200, the second openings includes a width $W'_2$ the same with the width $W'_1$ of the patterned sacrificial layer 236. An etching process 242 is subsequently performed to etch the first dielectric layer 222 and the CESL 220 through the second openings. Consequently, a plurality of first contact holes 242 are formed in the first dielectric layer 222 and the CESL 220. More important, a liner 254 is formed to cover bottoms and sidewalls of the first contact holes 242 as shown in FIG. 17.

Please refer to FIG. 18. After forming the liner 254, an etch back process 244 is performed to remove the liner 254 from the surface of the second dielectric layer 250 and from the bottoms of the first contact holes 242. Accordingly, liner spacers 254s covering the sidewalls of the first contact holes 242 are obtained. And the sources/drains 216 are exposed at the bottoms of the first contact holes 242. Subsequently, silicide layers 218 are formed on the sources/drains 216 exposed at bottoms of the first contact holes 224. The silicides 218 can be formed by any suitable process, preferably but not limited to post contact salicide process. And the first contact plugs (not shown) are subsequently formed as mentioned above.

Additionally, those skilled in the art would easily realize that the abovementioned modification can also be integrated after the RMG process as described in the fourth preferred embodiment.

According to the method for manufacturing contact plugs for semiconductor devices provided by the third and fourth preferred embodiments and the modifications, the first contact plugs 260 are formed by replacing the patterned sacrificial layer 236, whose width is reduced by forming the liner 254. Therefore, process window for forming the first contact plugs 260 is improved. Furthermore, the method for manufacturing the contact plugs for semiconductor devices provided by the third and fourth preferred embodiments can be easily integrated before or after the RMG process and thus the process flexibility is improved.

Figure 19:
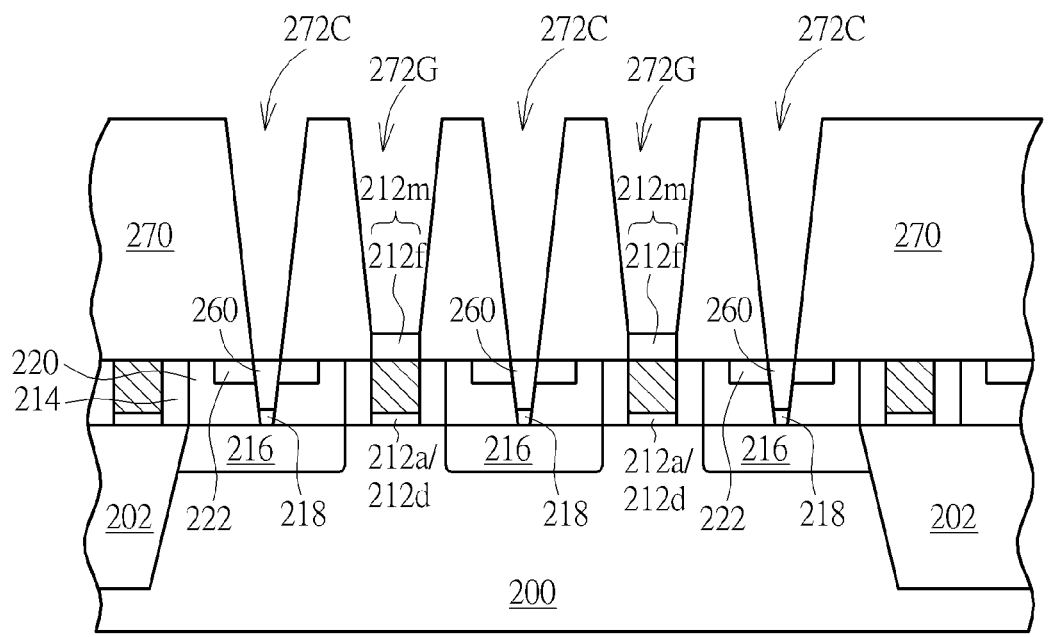
Figure 20:
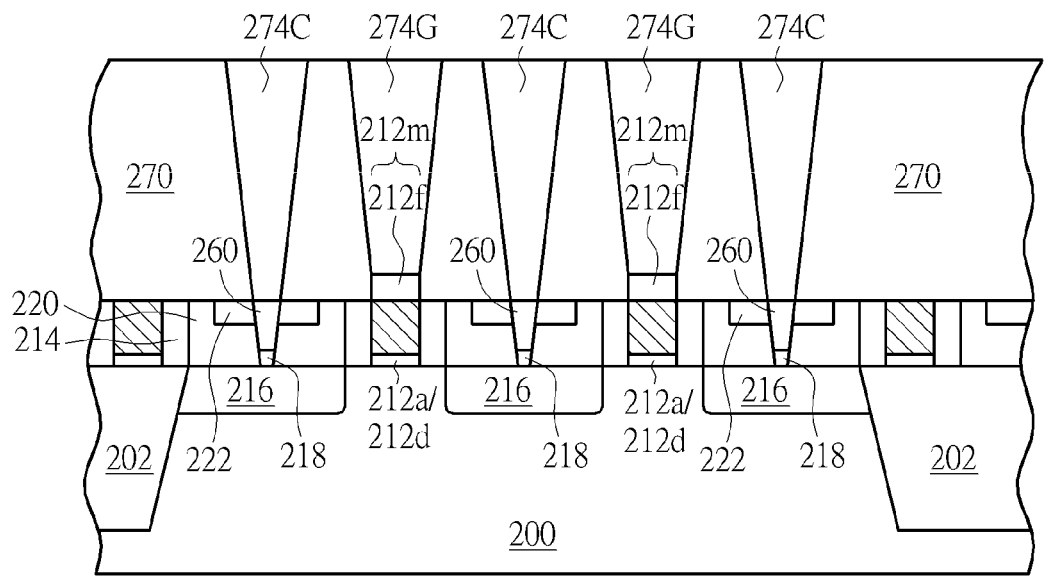

Please refer to FIGS. 19-20, which are schematic drawings illustrating the methods for manufacturing contact plugs for semiconductor devices provided by the first to fourth preferred embodiments of the present invention in step subsequent to FIGS. 8 and 15. It should be noted that though the elements in FIGS. 19-20 are designated by the numerals the same with the third and fourth preferred embodiment, the following disclosed steps can be performed after forming the first contact plugs 160 in accordance with both the first and second preferred embodiments.

As shown in FIG. 19, after forming the first contact plugs 260, a plurality of silicide layers 212f are formed on the metal gates 212e by any suitable process. Next, a third dielectric layer 270 is blanketly formed on the substrate 200 and followed by forming a plurality of second contact holes 272C/272G in the third dielectric layer 270. It is noteworthy that the second contact holes 272C are formed correspondingly to the first contact plug 260, and the second contact holes 272G are formed correspondingly to the metal gates 212m. Consequently, the first contact plugs 260 are respectively exposed at bottoms of the second contact holes 272C and the metal gates 212m are respectively exposed at bottoms of the second contact holes 272G.

Additionally, in another modification to the present invention, a post-salicide process can be performed. In this modification, the third dielectric layer 270 is formed on the substrate 202, the second contact holes 272G corresponding to the metal gates 212m are formed and following by forming silicide layers 262 respectively at the bottoms of the second contact holes 272G. That is, the silicides layers 262 are formed on the metal gates 212m. Subsequently, the second contact holes 262C corresponding to the first contact plugs 260 are formed in the third dielectric layer 270 and thus the first contact plugs 260 are exposed at bottoms of the second contact holes 272C.

Please refer to FIG. 20. Subsequently, a conductive material is formed to fill up the second contact holes 272C/272G and followed by performing a planarization process to remove superfluous conductive material. A plurality of second contact plugs 274C electrically connected to the first contact plugs 260, and a plurality of second contact plugs 274G electrically connected to the metal gates 212m are obtained as shown in FIG. 20. Accordingly, electrical connection to the transistors 210 is constructed. Thereafter, interconnection process can be performed to accomplish circuit construction.

According to the method for manufacturing the contact plugs for semiconductor devices provided by the present invention, the contact holes are formed by replacing the patterned sacrificial layer. Furthermore, by performing the trimming step or by forming the liner, a width of the contact holes can be further reduced. Therefore a contact hole pattern with larger process window is obtained. More important, short circuit between the gates and the sources/drains caused by contact plug misalignment or contact plug shift is avoided. Additionally, the method for manufacturing the contact plugs for semiconductor devices provided by the present invention can be easily adopted before or after RMG process and therefore further provides improved process flexibility.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing contact plugs for semiconductor devices, comprising:
   providing a substrate comprising a plurality of transistors and a first dielectric layer filling spaces between the transistors formed thereon, wherein the transistors respectively comprises a gate and a source/drain;
   forming a plurality of silicide layers respectively on the gates;
   forming a sacrificial layer, a mask layer, and a patterned photoresist layer sequentially on the first dielectric layer after forming the silicide layers;
   etching the mask layer and the sacrificial layer through the patterned photoresist layer to form a patterned sacrificial layer on the first dielectric layer, the patterned sacrificial layer comprising a plurality of first openings corresponding to the gates of the transistors;
   forming a second dielectric layer filling up the first openings;
   removing the patterned sacrificial layer to form a plurality of second openings in the second dielectric layer, the second openings being formed correspondingly to the sources/drains of the transistors;
   performing an etching process to etch the first dielectric layer through the second openings to form a plurality of first contact holes exposing the sources/drains of the transistors; and
   forming a plurality of first contact plugs respectively in the first contact holes.

2. The method for manufacturing the contact plugs for semiconductor devices according to claim 1, wherein the gates of the transistors respectively comprise at least a gate dielectric layer and a polysilicon dummy gate.

3. The method for manufacturing the contact plugs for semiconductor devices according to claim 1, wherein the gates of the transistors respectively comprise at least a high-k gate dielectric layer and a metal gate electrode.

4. The method for manufacturing the contact plugs for semiconductor devices according to claim 3, wherein the metal gates are formed by performing a replace metal gate (RMG) process after forming the first contact plugs.

5. The method for manufacturing the contact plugs for semiconductor devices according to claim 3, wherein the metal gates are formed by performing a replace metal gate (RMG) process before forming the patterned sacrificial layer.

6. The method for manufacturing the contact plugs for semiconductor devices according to claim 1, wherein an etching rate of the sacrificial layer is different from an etching rate of the first dielectric layer.

7. The method for manufacturing the contact plugs for semiconductor devices according to claim 1, further comprising performing a trimming step to the patterned sacrificial layer to enlarge the first openings.

8. The method for manufacturing the contact plugs for semiconductor devices according to claim 7, wherein a width of the second openings is equal to a width of contact holes.

9. The method for manufacturing the contact plugs for semiconductor devices according to claim 1, further comprising forming a liner covering sidewalls and bottoms of the second openings after removing the patterned sacrificial layer.

10. The method for manufacturing the contact plugs for semiconductor devices according to claim 1, further comprising forming liner spacers covering sidewalls of the first contact holes after etching the first dielectric layer.

11. The method for manufacturing the contact plugs for semiconductor devices according to claim 1, further comprising forming a plurality of silicide layers respectively on portions of the sources/drains exposed at bottoms of the first contact holes before forming the first contact plugs.

12. The method for manufacturing the contact plugs for semiconductor devices according to claim 1, wherein the step of forming the first contact plugs further comprises:
    filling up the first contact holes with a conductive material; and
    performing a planarization process to remove superfluous conductive material and the second dielectric layer to form the first contact plugs electrically connected to the sources/drains of the transistor,
    wherein a top surface of the first dielectric layer, top surfaces of the gates, and top surfaces of the first contact plugs are all coplanar.

13. The method for manufacturing the contact plugs for semiconductor devices according to claim 1, further comprising forming a third dielectric layer on the transistors, the first contact plugs, and the first dielectric layer.

14. The method for manufacturing the contact plugs for semiconductor devices according to claim 13, further comprising:
    etching the third dielectric layer to form a plurality of second contact holes in the third dielectric layer; and
    forming a plurality of second contact plugs respectively in the second contact holes.

15. The method for manufacturing the contact plugs for semiconductor devices according to claim 14, wherein the second contact plugs are electrically connected to the first contact plugs, respectively.

16. The method for manufacturing the contact plugs for semiconductor devices according to claim 14, wherein the second contact plugs are electrically connected to the first contact plugs and the gates, respectively.

17. A method for manufacturing contact plugs for semiconductor devices, comprising:
    providing a substrate comprising a plurality of transistors and a first dielectric layer filling spaces between the transistors formed thereon, wherein the transistors respectively comprises a gate and a source/drain;
    forming a patterned sacrificial layer on the first dielectric layer, the patterned sacrificial layer comprising a plurality of first openings corresponding to the gates of the transistors;
    forming a second dielectric layer filling up the first openings;
    removing the patterned sacrificial layer to form a plurality of second openings in the second dielectric layer, the second openings being formed correspondingly to the sources/drains of the transistors;
    performing an etching process to etch the first dielectric layer through the second openings to form a plurality of first contact holes exposing the sources/drains of the transistors;
    forming a plurality of first contact plugs respectively in the first contact holes;
    forming a third dielectric layer on the transistors, the first contact plugs, and the first dielectric layer;
    etching the third dielectric layer to form a plurality of second contact holes in the third dielectric layer;
    forming a plurality of silicide layers on tops of the gates respectively after forming the second contact holes; and
    forming a plurality of second contact plugs respectively in the second contact holes.

* * * * *